(12) United States Patent
Li et al.

(10) Patent No.: US 10,368,312 B2
(45) Date of Patent: Jul. 30, 2019

(54) METHOD, DEVICE, AND SYSTEM FOR DETECTING DEVICE POWER

(71) Applicant: Huawei Technologies Co., Ltd., Shenzhen (CN)

(72) Inventors: Zijun Li, Shenzhen (CN); Fen Yang, Nanjing (CN); Zhandong Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 657 days.

(21) Appl. No.: 14/902,285

(22) PCT Filed: May 30, 2014

(86) PCT No.: PCT/CN2014/078981
§ 371 (c)(1),
(2) Date: Dec. 30, 2015

(87) PCT Pub. No.: WO2015/180158
PCT Pub. Date: Dec. 3, 2015

(65) Prior Publication Data
US 2017/0013558 A1    Jan. 12, 2017

(51) Int. Cl.
*H04W 52/02* (2009.01)
*H04B 5/00* (2006.01)
(Continued)

(52) U.S. Cl.
CPC .. *H04W 52/0258* (2013.01); *G01R 19/16542* (2013.01); *G01R 31/3835* (2019.01); *G01R 31/44* (2013.01); *H02J 7/0047* (2013.01); *H04B 5/00* (2013.01); *H04M 1/73* (2013.01); *H04W 52/0254* (2013.01); *H04W 52/0261* (2013.01);
(Continued)

(58) Field of Classification Search
None
See application file for complete search history.

(56) References Cited

U.S. PATENT DOCUMENTS 6,133,739 A * 10/2000 Kvaas ............... G01R 31/3624
324/426
8,076,904 B2   12/2011 Nakano et al.
(Continued)

FOREIGN PATENT DOCUMENTS

CN         1909694 A    2/2007
CN      101025437 A    8/2007
(Continued)

*Primary Examiner* — Hicham B Foud
(74) *Attorney, Agent, or Firm* — Leydig, Voit & Mayer, Ltd.

(57) ABSTRACT

Embodiments of the present invention provide a method, a device, and a system for detecting device power. The method for detecting device power according to the present invention includes: detecting, by a monitoring terminal, power information of a monitored device; setting a monitoring time interval according to the power information and a preset time interval; and detecting the power information of the monitored device according to the monitoring time interval. The embodiments of the present invention implement that a time interval between next detection and current detection is determined according to detected power information, which can fully save resources without affecting use of a user.

17 Claims, 4 Drawing Sheets

The monitoring terminal detects power information of the monitored device at two consecutive times — 110

Calculate a power decline rate of the monitored device according to the power information detected at two consecutive times and the preset time interval — 111

If the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval — 112

(51) Int. Cl.
*H04M 1/73* (2006.01)
*G01R 19/165* (2006.01)
*H02J 7/00* (2006.01)
*G01R 31/44* (2006.01)
*G01R 31/3835* (2019.01)

(52) U.S. Cl.
CPC ......... *H02J 2007/005* (2013.01); *Y02D 70/00* (2018.01); *Y02D 70/142* (2018.01); *Y02D 70/144* (2018.01); *Y02D 70/166* (2018.01); *Y02D 70/26* (2018.01)

(56) References Cited

U.S. PATENT DOCUMENTS

| | | | |
|---|---|---|---|
| 8,450,978 B2 | 5/2013 | Barsukov et al. | |
| 9,575,526 B2* | 2/2017 | Nagahama | G04C 10/00 |
| 9,876,352 B2* | 1/2018 | Biswas | H02J 3/00 |
| 2002/0132649 A1* | 9/2002 | Motohashi | H04W 52/0261 |
| | | | 455/572 |
| 2005/0009577 A1* | 1/2005 | Kangas | H04M 1/7253 |
| | | | 455/572 |
| 2006/0135218 A1* | 6/2006 | Son | H04B 1/3877 |
| | | | 455/573 |
| 2007/0188146 A1 | 8/2007 | Nakano et al. | |
| 2008/0057868 A1* | 3/2008 | Chang | H04M 1/6058 |
| | | | 455/41.2 |
| 2010/0315562 A1 | 12/2010 | Dai | |
| 2011/0136437 A1 | 6/2011 | Zhao | |
| 2011/0273998 A1 | 11/2011 | Mudrick et al. | |
| 2013/0226486 A1* | 8/2013 | Henderson | G01R 31/3606 |
| | | | 702/63 |
| 2015/0077126 A1* | 3/2015 | Wang | H01M 10/44 |
| | | | 324/428 |
| 2017/0126030 A1* | 5/2017 | Hamada | H02J 7/0021 |

FOREIGN PATENT DOCUMENTS

| | | |
|---|---|---|
| CN | 101127993 A | 2/2008 |
| CN | 101202555 A | 6/2008 |
| CN | 101287037 A | 10/2008 |
| CN | 101345554 A | 1/2009 |
| CN | 101442574 A | 5/2009 |
| CN | 101923770 A | 12/2010 |
| CN | 102711110 A | 10/2012 |
| CN | 102820912 A | 12/2012 |
| CN | 103038657 A | 4/2013 |
| EP | 2224575 A1 | 9/2010 |
| JP | H06230090 A | 8/1994 |
| JP | H11135159 A | 5/1999 |
| KR | 20010026356 | 4/2001 |
| KR | 20140055176 | 5/2014 |

* cited by examiner

METHOD, DEVICE, AND SYSTEM FOR DETECTING DEVICE POWER

CROSS-REFERENCE TO RELATED APPLICATIONS

This application is a National Stage of International Application No. PCT/CN2014/078981, filed on May 30, 2014, which is hereby incorporated by reference in its entirety.

TECHNICAL FIELD

Embodiments of the present invention relates to the field of communications technologies, and in particular, to a method, a device, and a system for detecting device power.

BACKGROUND

With increasing use of smart devices, especially wearable devices in people's life, power management of these devices becomes a relatively prominent problem. For example, when a user wants to go to a gymnasium for many times, a wristband displays a red-yellow light to prompt that the wristband should be charged. For example, some smart devices can deliver a prompt when power is low; however, a case usually appears that no prompt is delivered when a user pays attention, but a prompt is delivered when the user pays no attention; for example, no prompt is given before an owner goes to sleep (power still does not reach a lowest limit, and therefore no prompt is given), but a charging prompt is given after the owner falls asleep.

A principle of a method for displaying power of a Bluetooth device on a Bluetooth mobile phone in the prior art is as follows: The Bluetooth device periodically calculates remaining power of the device, and then sends the remaining power to the Bluetooth mobile phone; the Bluetooth mobile phone determines whether the foregoing remaining power is greater than a set threshold; if a calculation result is greater than the set threshold, the remaining power of the Bluetooth device is displayed on a screen of the Bluetooth mobile phone; and if the calculation result is less than the set threshold, the remaining power of the Bluetooth device is displayed on the screen of the Bluetooth mobile phone, and an alarm is given.

A problem existing in the prior art is that a Bluetooth device needs to periodically detect power, but the power is sufficient in most cases, and therefore such detection is unnecessary and causes a waste of resources.

SUMMARY

Embodiments of the present invention provide a method, a device, and a system for detecting device power, so as to resolve a problem in the prior art that periodic power detection causes a waste of resources.

According to a first aspect, an embodiment of the present invention provides a method for detecting device power, where the method includes: detecting, by a monitoring terminal, power information of a monitored device; setting a monitoring time interval according to the power information and a preset time interval; and detecting the power information of the monitored device according to the monitoring time interval.

With reference to the first aspect, in a first implementation manner of the first aspect, the detecting, by a monitoring terminal, power information of a monitored device includes: detecting, by the monitoring terminal, power information of the monitored device at two consecutive times; and the setting a monitoring time interval according to the power information and a preset time interval includes: calculating a power decline rate of the monitored device according to the power information detected at two consecutive times and the preset time interval; and if the power decline rate of the monitored device is less than a preset power decline rate, setting the monitoring time interval to be greater than duration of the preset time interval; or if the power decline rate of the monitored device is greater than a preset power decline rate, setting the monitoring time interval to be less than duration of the preset time interval.

With reference to the first aspect, in a second implementation manner of the first aspect, before the setting a monitoring time interval according to the power information and a time interval, the method includes: dividing a power range into different power intervals according to a preset power value; and determining, according to the acquired power information, a power interval in which power of the monitored device lies.

With reference to the second implementation manner of the first aspect, in a third implementation manner of the first aspect, the power intervals include a high-level power interval and a low-level power interval; the high-level power interval is that a minimum power value of the power interval is greater than a preset power threshold; and the low-level power interval is that the minimum power value of the power interval is less than the preset power threshold; and the setting a monitoring time interval according to the power information and a preset time interval includes: if it is determined, according to the acquired power information, that the power interval in which the power of the monitored device lies is a high-level power interval, setting the monitoring time interval to be greater than duration of the preset time interval; or if it is determined, according to the acquired power information, that the power interval in which the power of the monitored device lies is a low-level power interval, setting the monitoring time interval to be less than duration of the preset time interval.

With reference to the first aspect, in a fourth implementation manner of the first aspect, the power information includes a use frequency of the monitored device; the setting a monitoring time interval according to the power information and a time interval includes: when the use frequency indicated by the power information is higher than a preset use frequency, setting the monitoring time interval to be less than duration of the preset time interval; or when the use frequency indicated by the power information is lower than a preset use frequency, setting the monitoring time interval to be greater than duration of the preset time interval.

With reference to the first aspect or any one of the first to fourth implementation manners of the first aspect, in a fifth implementation manner of the first aspect, the detecting, by a monitoring terminal, power information of a monitored device includes: sending, by the monitoring terminal, a query request for the power information to the monitored device; or detecting and acquiring, by the monitoring terminal, the power information actively reported by the monitored device.

With reference to the first aspect or any one of the first to third implementation manners of the first aspect, in a sixth implementation manner of the first aspect, after the detecting the power information of the monitored device according to the monitoring time interval, the method includes:

determining, by the monitoring terminal according to the power information and the preset power threshold, whether it is necessary to give an alarm, and if necessary, delivering an alarm; or sending the monitoring time interval and the preset power threshold to the monitored device, so that the monitored device detects and acquires the power information of the monitored device according to the monitoring time interval, and determines, according to the power information and the preset power threshold, whether to deliver an alarm.

According to a second aspect, an embodiment of the present invention provides a monitoring terminal, including:

a detecting module, configured to detect power information of a monitored device; and a setting module, configured to set a monitoring time interval according to the power information and a preset time interval, where the detecting module is further configured to detect the power information of the monitored device according to the monitoring time interval.

With reference to the second aspect, in a first implementation manner of the second aspect, the detecting module is specifically configured to detect power information of the monitored device at two consecutive times; and the setting module is specifically configured to:

calculate a power decline rate of the monitored device according to the power information detected at two consecutive times and the preset time interval; and if the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval.

With reference to the second aspect, in a second implementation manner of the second aspect, the setting module is further configured to:

divide a power range into different power intervals according to a preset power value; and determine, according to the acquired power information, a power interval in which power of the monitored device lies.

With reference to the second implementation manner of the second aspect, in a third implementation manner of the second aspect, the power intervals include a high-level power interval and a low-level power interval; the high-level power interval is that a minimum power value of the power interval is greater than a preset power threshold; and the low-level power interval is that the minimum power value of the power interval is less than the preset power threshold; and the setting module is specifically configured to:

if it is determined, according to the acquired power information, that the power interval in which the power of the monitored device lies is a high-level power interval, set the monitoring time interval to be greater than duration of the preset time interval; or if it is determined, according to the acquired power information, that the power interval in which the power of the monitored device lies is a low-level power interval, set the monitoring time interval to be less than duration of the preset time interval.

With reference to the second aspect, in a fourth implementation manner of the second aspect, the power information includes a use frequency of the monitored device; and the setting module is specifically configured to:

when the use frequency indicated by the power information is higher than a preset use frequency, set the monitoring time interval to be less than duration of the preset time interval; or when the use frequency indicated by the power information is lower than a preset use frequency, set the monitoring time interval to be greater than duration of the preset time interval.

With reference to the second aspect or any one of the first to fourth implementation manners of the second aspect, in a fifth implementation manner of the second aspect, the detecting module is specifically configured to:

send a query request for the power information to the monitored device; or detect and acquire the power information actively reported by the monitored device.

With reference to the second aspect or any one of the first to third implementation manners of the second aspect, in a sixth implementation manner of the second aspect, the monitoring terminal further includes:

an alarm module, configured to determine, according to the power information and the preset power threshold, whether it is necessary to give an alarm, and if necessary, deliver an alarm; or an alarm module, configured to send the monitoring time interval and the preset power threshold to the monitored device, so that the monitored device detects and acquires the power information of the monitored device according to the monitoring time interval, and determines, according to the power information and the preset power threshold, whether to deliver an alarm.

According to a third aspect, an embodiment of the present invention provides a monitoring terminal, including: a communicator, a memory, and a processor, where the communicator is configured to send a query request to a monitored device, and receive power information returned by the monitored device; the memory is configured to store an execution instruction or data; and when the monitoring terminal runs, the processor communicates with the memory, and the processor is configured to: detect power information of the monitored device; set a monitoring time interval according to the power information and a preset time interval; and detect the power information of the monitored device according to the monitoring time interval.

With reference to the third aspect, in a first implementation manner of the third aspect, the processor is further configured to: detect, by the monitoring terminal, power information of the monitored device at two consecutive times;

calculate a power decline rate of the monitored device according to the power information detected at two consecutive times and the preset time interval; and if the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval.

With reference to the third aspect, in a second implementation manner of the third aspect, the processor is further configured to: divide a power range into different power intervals according to a preset power value; and determine, according to the acquired power information, a power interval in which power of the monitored device lies.

With reference to the second implementation manner of the third aspect, in a third implementation manner of the third aspect, the power intervals include a high-level power interval and a low-level power interval; the high-level power interval is that a minimum power value of the power interval is greater than a preset power threshold; and the low-level power interval is that the minimum power value of the power interval is less than the preset power threshold; and the processor is further configured to: if it is determined, according to the acquired power information, that the power interval in which the power of the monitored device lies is a high-level power interval, set the monitoring time interval to be greater than duration of the preset time interval; or if it is determined, according to the acquired power information, that the power interval in which the power of the monitored device lies is a low-level power interval, set the monitoring time interval to be less than duration of the preset time interval.

With reference to the third aspect, in a fourth implementation manner of the third aspect, the power information includes a use frequency of the monitored device; and the processor is further configured to: when the use frequency indicated by the power information is higher than a preset use frequency, set the monitoring time interval to be less than duration of the preset time interval; or when the use frequency indicated by the power information is lower than a preset use frequency, set the monitoring time interval to be greater than duration of the preset time interval.

With reference to the third aspect or the first to third implementation manners of the third aspect, in a fifth implementation manner of the third aspect, the processor is further configured to: determine, according to the power information and the preset power threshold, whether it is necessary to give an alarm, and if necessary, deliver an alarm; or send the monitoring time interval and the preset power threshold to the monitored device, so that the monitored device detects and acquires the power information of the monitored device according to the monitoring time interval, and determines, according to the power information and the preset power threshold, whether to deliver an alarm.

According to a fourth aspect, an embodiment of the present invention provides a monitored device, including: a communicator, a memory, a processor, and a battery, where the battery is configured to supply power to different parts of the monitored device to maintain running of the monitored device; the communicator is configured to receive a query request sent by a monitoring terminal, and return power information to the monitoring terminal; and is further configured to receive a monitoring time interval and a preset power threshold that are sent by the monitoring terminal; the memory is configured to store an execution instruction or data; when the monitored device runs, the processor communicates with the memory, and the processor is configured to: respond to the query request of the monitoring terminal, detect current power of the battery, and return the power information to the monitoring terminal; and detect and acquire the power information of the monitored device according to the monitoring time interval sent by the monitoring terminal, and determine, according to the power information and the preset power threshold, whether to deliver an alarm.

According to a fifth aspect, an embodiment of the present invention provides a system for detecting device power, where the system includes:

a monitoring terminal and at least one monitored device, where the monitoring terminal is configured to detect power information of a monitored device, set a monitoring time interval according to the power information and a preset time interval, and detect the power information of the monitored device according to the monitoring time interval;

the monitored device is configured to respond to a query request of the monitoring terminal, detect current power of a battery, and return the power information to the monitoring terminal; and the monitored device is further configured to detect and acquire the power information of the monitored device according to the monitoring time interval sent by the monitoring terminal, and determine, according to the power information and a preset power threshold, whether to deliver an alarm.

According to the method, the device, and the system for detecting device power in the embodiments of the present invention, power information of a monitored device is detected by a monitoring terminal, and a time interval is determined according to the detected and acquired power information, where the time interval refers to an interval of detecting, by the monitoring terminal, power information of the monitored device at two consecutive times, which implements that a time interval between next detection and current detection is determined according to detected power information, and the monitored device does not need to regularly report remaining power, so as to save energy. The monitoring terminal reduces a quantity of times of queries in a self-learning manner, and resolves a problem in the prior art that periodic power detection causes a waste of resources.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Figure 1:
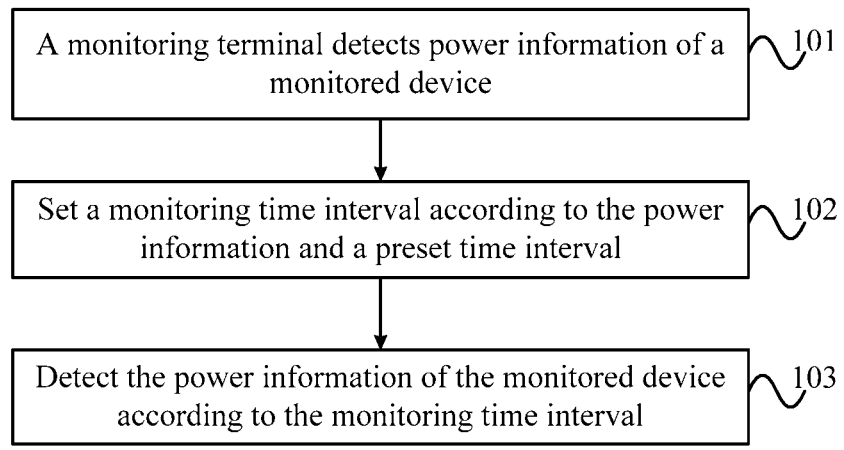
FIG. 1 is a flowchart of an embodiment of a method for detecting device power according to the present invention.

FIG. 1 is a flowchart of a first embodiment of a method for detecting device power according to the present invention. This embodiment may be executed by a monitoring terminal, such as a smartphone. A solution in this embodiment is used between the monitoring terminal and a monitored device to perform power detection. The monitored device is, for example, a smart device, such as a smart band or a Bluetooth headset. As shown in FIG. 1, the method in this embodiment may include:

Step 101: The monitoring terminal detects power information of the monitored device.

Step 102: Set a monitoring time interval according to the power information and a preset time interval.

Step 103: Detect the power information of the monitored device according to the monitoring time interval.

Specifically, there is a short-range (point-to-point communication and local area network) or long-range (Internet) network connection between the monitoring terminal and the monitored device; the network connection does not need to be always maintained, and may be intermittently connected. After the monitoring terminal performs a communication connection to the monitored device, if a time to detect power of the monitored device arrives, the monitoring terminal detects the power information of the monitored device, and sets the monitoring time interval according to the detected and acquired power information and the preset time interval, that is, determines a time interval between next detection on the power information of the monitored device and current detection. If the monitoring terminal does not have a record of a previous query time, the monitoring terminal considers by default that the power of the monitored device needs to be detected currently, that is, considers that the time to detect the power of the monitored device arrives. Afterwards, a time to detect the power of the monitored device is determined according to the monitoring time interval.

Optionally, the power information includes at least one of the following: power and a use frequency.

Figure 1A:
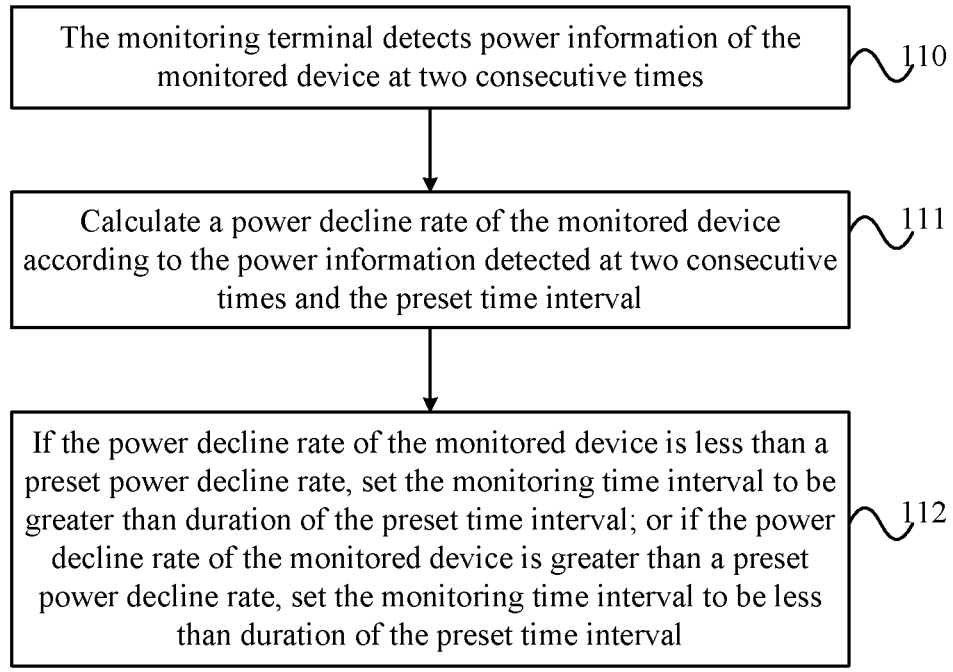
FIG. 1A is a flowchart of another embodiment of a method for detecting device power according to the present invention.
Figure 1B:
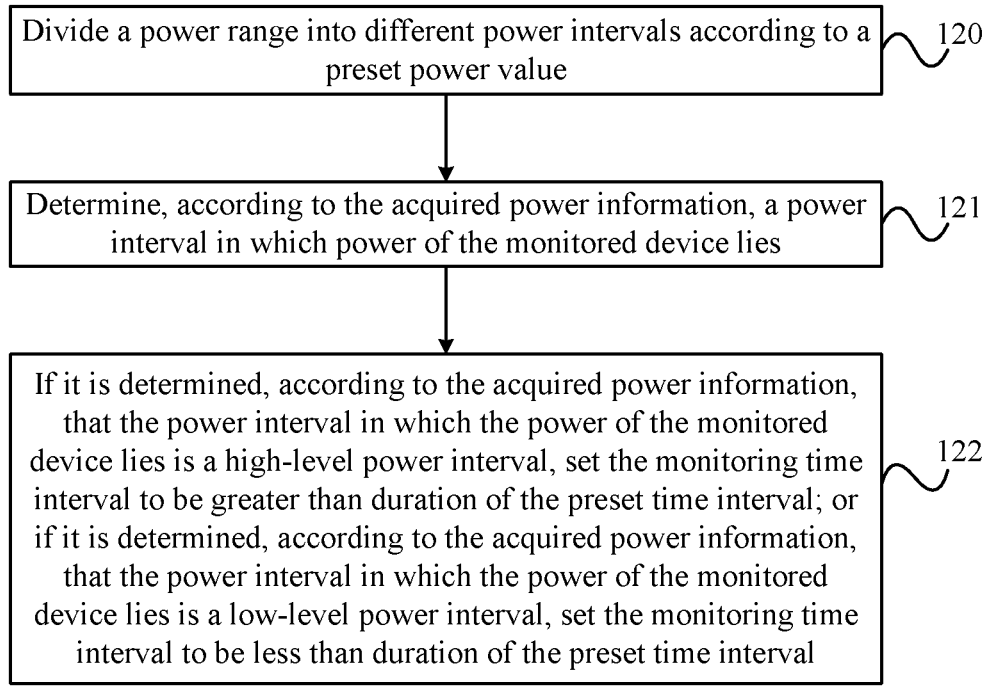
FIG. 1B is a flowchart of another embodiment of a method for detecting device power according to the present invention.

FIG. 1A is a flowchart of another embodiment of a method for detecting device power according to the present invention. FIG. 1B is a flowchart of another embodiment of a method for detecting device power according to the present invention.

In another embodiment of the method according to the present invention, setting the monitoring time interval according to the power information and the preset time interval includes at least one of the following implementation manners:

As shown in FIG. 1A, a first implementation manner is as follows:

That the monitoring terminal detects the power information of the monitored device includes:

Step 110: The monitoring terminal detects power information of the monitored device at two consecutive times.

Correspondingly, the setting the monitoring time interval according to the power information and the preset time interval includes:

Step 111: Calculate a power decline rate of the monitored device according to the power information detected at two consecutive times and the preset time interval.

Step 112: If the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval.

Specifically, the power decline rate is calculated according to power of the power information acquired by two consecutive times of detection, and the power decline rate indicates a decline extent of power in a unit time. The following formula is a reference formula of the power decline rate: Power decline rate=(Former power−Latter power)/Former power. Certainly, another formula that conforms to a decline rate principle may also be used. Compared with the preset power decline rate, if the power decline rate is less than the preset power decline rate, the monitoring time interval may be set to be greater than the duration of the preset time interval; and compared with the preset power decline rate, if the power decline rate is greater than the preset power decline rate, the monitoring time interval may be set to be less than the duration of the preset time interval.

As shown in FIG. 1B, a second implementation manner is as follows: Before the setting the monitoring time interval according to the power information and the preset time interval, the method includes:

Step 120: Divide a power range into different power intervals according to a preset power value.

Step 121: Determine, according to the acquired power information, a power interval in which power of the monitored device lies.

Optionally, the power intervals include a high-level power interval and a low-level power interval; the high-level power interval is that a minimum power value of the power interval is greater than a preset power threshold; and the low-level power interval is that the minimum power value of the power interval is less than the preset power threshold; and the setting the monitoring time interval according to the power information and the preset time interval includes:

Step 122: If it is determined, according to the acquired power information, that the power interval in which the power of the monitored device lies is a high-level power interval, set the monitoring time interval to be greater than duration of the preset time interval; or if it is determined, according to the acquired power information, that the power interval in which the power of the monitored device lies is a low-level power interval, the monitoring time interval is set to be less than duration of the preset time interval.

Specifically, the power range of the monitored device may be first divided into different power intervals according to the preset power value; for example, 0-20% is an interval 1, 20%-40% is an interval 2, 40%-60% is an interval 3, 60%-80% is an interval 4, and 80%-100% is an interval 5. The power interval in which the power lies is determined according to the acquired power information; if the power is 70%, the power interval is the interval 4, the interval 4 belongs to a high-level power interval, and the monitoring time interval may be set to be greater than the duration of the preset time interval; and if the power is 30%, the power interval is the interval 2, the interval 2 belongs to a low-level power interval, and the monitoring time interval may be set to be less than the duration of the preset time interval.

A high-level power interval and a low-level power interval may be determined according to comparison between a minimum power value of the power interval and a preset power threshold; for example, a minimum power value of the high-level power interval is greater than a preset power threshold 50%, and the minimum power value of the high-level power interval is less than the preset power threshold 50%.

A third implementation manner is as follows: The power information includes a use frequency of the monitored device; and the setting the monitoring time interval according to the power information and the preset time interval includes:

when the use frequency indicated by the power information is higher than a preset use frequency, setting the monitoring time interval to be less than duration of the preset time interval; or when the use frequency indicated by the power information is lower than a preset use frequency, setting the monitoring time interval to be greater than duration of the preset time interval.

Specifically, in some scenarios, the monitoring terminal may obtain a use rule of the monitored device. For example, each time the monitored device (for example, a smart band) is used, data is transferred to the monitoring terminal (for example, a smartphone); in this way, the smartphone can know a time at which the smart band is used and a use frequency about how many days at which the smart band is used once, so that the smartphone can make arrangement for power detection. Many manners are available for the monitoring terminal to detect the use rule of the monitored device. Two possible detection manners are: detecting a time at which the monitored device uploads data to the monitoring terminal, and detecting a time at which an application program is started to use the data on the monitoring terminal, and the like.

The power information detected and acquired by a monitoring device includes the use frequency. The monitoring time interval may be set according to the use frequency and the preset time interval. If the use frequency of the monitored device is relatively high and higher than the preset use frequency, the monitoring time interval is set to be less than the duration of the preset time interval; and if the use frequency of the monitored device is relatively low and lower than the preset use frequency, the monitoring time interval is set to be greater than the duration of the preset time interval.

A fourth implementation manner is as follows: The setting the monitoring time interval according to the power information and a time interval includes:

setting the monitoring time interval according to a use time and required charging duration of the monitored device, and a current time.

Specifically, the monitoring terminal may also set the required charging duration of the monitored device in a configuration manner, for example, the required charging duration that is of the monitored device and configured on the monitoring terminal is two hours; or the required charging duration is calculated in a manner of detecting the monitored device for multiple times, for example, power detected at the first time is 10%, power detected at the second time is 30%, power detected at the third time is 90%, and then the required charging duration may be estimated according to time intervals between the three times of detection. A monitoring time interval for next power detection is calculated according to the use time, the use frequency, and the required charging duration of the monitored device. For example, a user needs to wear a wristband to go jogging at 19:00 every day, the required charging duration is two hours, and then a reference formula for calculating the monitoring time interval of power detection is: Monitoring time interval=19−Current time−Required charging duration.

For example, the current time is 12:00, and then it can be calculated that the monitoring time interval=19−12−2=5 (hours).

Optionally, the detecting, by the monitoring terminal, the power information of the monitored device includes:

sending, by the monitoring terminal, a query request for the power information to the monitored device; or detecting and acquiring, by the monitoring terminal, the power information actively reported by the monitored device.

Specifically, the monitoring terminal sends the query request to the monitored device to query current power information. The monitored terminal calculates current power and returns the current power information to the monitoring terminal; or the monitored device actively reports the power information, and a reporting time may be set by the monitoring terminal. The monitoring terminal may use the foregoing method of step 101 and step 102 to set the monitoring time interval, send the monitoring time interval to the monitored device. After receiving the monitoring time interval, the monitored device sets a timer corresponding to the monitoring time interval, and if a timing time arrives, the monitored device calculates current power, and reports the power information to the monitoring terminal.

Optionally, after the detecting the power information of the monitored device according to the monitoring time interval, the method includes:

determining, by the monitoring terminal according to the power information and the preset power threshold, whether it is necessary to give an alarm, and if necessary, delivering an alarm; or sending the monitoring time interval and the preset power threshold to the monitored device, so that the monitored device detects and acquires the power information of the monitored device according to the monitoring time interval, and determines, according to the power information and the preset power threshold, whether to deliver an alarm.

Optionally, delivering the alarm includes:

delivering the alarm in a manner of display, a sound, or vibration.

Specifically, the monitoring terminal determines whether it is necessary to give an alarm, and whether to give an alarm is determined according to multiple factors: remaining power is lower than the preset power threshold; or remaining power is not lower than the preset power threshold, but an alarm is delivered in advance according to the remaining power, the required charging duration, the use time, and a historical record of the use frequency; and if it is determined that it is necessary, the monitoring terminal delivers the alarm.

The monitoring terminal calculates a monitoring time interval for next power information detection, and the monitoring terminal calculates or configures the preset power threshold (minimum power), and sends the time interval and the preset power threshold to the monitored device. The monitored device sets a timer according to the monitoring time interval, and detects power when a timing time of the timer arrives; and if power is lower than the preset power threshold, the monitored device delivers an alarm. Information about the alarm may be a display text, a display image, an indicator, a sound, vibration, or the like.

The monitoring device may also display the power information in a form of a notification message, for example, "A smart band has 30% power left, is it necessary to perform charging?", and a user determines at discretion whether to perform charging. In this way, it can be estimated that before the user uses the monitored device, enough time is reserved for charging.

In the present invention, many monitored devices can be managed by using a monitoring terminal, it is unnecessary to display power information of each monitored device on the monitoring terminal at all times, and the power information is displayed only when necessary.

In this embodiment, power information of a monitored device is detected by a monitoring terminal, and a monitoring time interval is determined according to the detected and acquired power information and a preset time interval; the monitoring terminal detects the power information of the monitored device according to the monitoring time interval, which implements that a monitoring time interval between next detection and current detection is determined according to detected power information, and after power is detected according to the monitoring time interval, it is determined whether to prompt a user, and the user can be prompted at a proper time; the monitored device does not need to regularly report remaining power, which saves energy. The monitoring terminal reduces a quantity of times of queries as much as possible in a self-learning manner, and resolves a problem in the prior art that periodic power detection causes a waste of resources.

Figure 2:
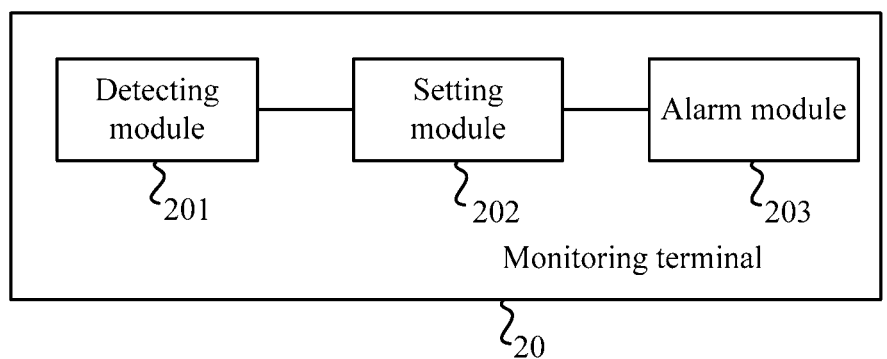
FIG. 2 is a schematic structural diagram of a first embodiment of a monitoring terminal according to the present invention.

FIG. 2 is a schematic structural diagram of a first embodiment of a monitoring terminal according to the present invention. As shown in FIG. 2, a monitoring terminal 20 provided in this embodiment includes a detecting module 201 and a setting module 202, where the detecting module 201 is configured to detect power information of a monitored device; the setting module 202 is configured to determine a monitoring time interval according to the power information and a preset time interval; and the detecting module 201 is further configured to detect the power information of the monitored device according to the monitoring time interval.

Optionally, the detecting module 201 is specifically configured to detect power information of the monitored device at two consecutive times; and the setting module 202 is specifically configured to:

calculate a power decline rate of the monitored device according to the power information detected at two consecutive times and the preset time interval; and if the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval.

Optionally, the setting module 202 is further configured to:

divide a power range into different power intervals according to a preset power value; and determine, according to the acquired power information, a power interval in which power of the monitored device lies.

Optionally, the power intervals include a high-level power interval and a low-level power interval; the high-level power interval is that a minimum power value of the power interval is greater than a preset level threshold; and the low-level power interval is that the minimum power value of the power interval is less than the preset level threshold; and the setting module 202 is specifically configured to:

if it is determined, according to the acquired power information, that the power interval in which the power of the monitored device lies is a high-level power interval, set the monitoring time interval to be greater than duration of the preset time interval; or if it is determined, according to the acquired power information, that the power interval in which the power of the monitored device lies is a low-level power interval, set the monitoring time interval to be less than duration of the preset time interval.

Optionally, the power information includes a use frequency of the monitored device; and the setting module 202 is specifically configured to:

when the use frequency indicated by the power information is higher than a preset use frequency, set the monitoring time interval to be less than duration of the preset time interval; or when the use frequency indicated by the power information is lower than a preset use frequency, set the monitoring time interval to be greater than duration of the preset time interval.

Optionally, the detecting module 201 is specifically configured to:

send a query request for the power information to the monitored device; or detect and acquire the power information actively reported by the monitored device.

Optionally, the monitoring terminal in this embodiment may further include:

an alarm module 203, configured to determine, according to the power information and the preset power threshold, whether it is necessary to give an alarm, and if necessary, deliver an alarm; or an alarm module 203, configured to send the monitoring time interval and the preset power threshold to the monitored device, so that the monitored device detects and acquires the power information of the monitored device according to the monitoring time interval, and determines, according to the power information and the preset power threshold, whether to deliver an alarm.

Optionally, the delivering the alarm includes:

delivering the alarm in a manner of display, a sound, or vibration.

Optionally, the power information includes at least one of the following: power and a use frequency.

Figure 3:
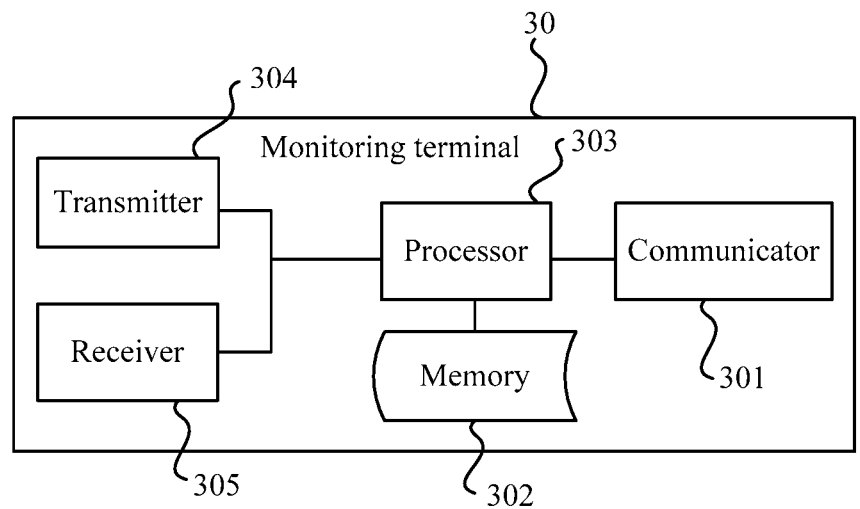
FIG. 3 is a schematic structural diagram of a second embodiment of a monitoring terminal according to the present invention.

FIG. 3 is a schematic structural diagram of a second embodiment of a monitoring terminal according to the present invention. As shown in FIG. 3, a monitoring terminal 30 provided in this embodiment includes a communicator 301, a memory 302, and a processor 303; and may further include a transmitter 304 and a receiver 305. The transmitter 304 and the receiver 305 may be connected to the processor 303. The transmitter 304 is configured to send data or information, and the receiver 305 is configured to receive the data or information.

The communicator 301 is configured to communicate with a monitored device or another device, send a query request to the monitored device, and receive power information returned by the monitored device; and is further configured to send a monitoring time interval and a preset power threshold to the monitored device, may establish a communication link between the monitoring terminal and the monitored device, and a data transmission channel, for example, the Transmission Control Protocol (TCP for short), or the User Datagram Protocol (UDP for short) on this basis, for example, Bluetooth, a WLAN, and the like that support near field communication; or the monitoring terminal is enabled to access the Internet, for example, a cellular network, and communicate with a remote monitored device through the Internet.

The memory 302 is configured to store an execution instruction or data, where the data includes but not limited to: power information, a preset time interval, a preset power decline rate, a preset power value, a preset level threshold, a preset use frequency, a preset power threshold, and the like; the memory 302 includes a persistent memory and a non-persistent memory, where the former may be a hard disk, an SD card, or the like, and is configured to store an operating system, a browser engine, a client of a management module, a user identification module, another application program (for example, an application program of the monitored device, which is corresponding to the monitored device; if there is an application program, a use time, a use frequency, and the like of the application program may provide a basis for calculating a time interval of detection), or the like; the latter may be a memory, and when a program runs, the program needs to be loaded from the persistent memory to the memory; the memory further saves temporary data generated in a running process of the program; the operating system is a running environment of the program, encapsulates a hardware capability of the monitoring terminal, and is invoked by an application program in a form of a software interface. The operating system provides a management capability of an application program. No matter which application program is started, the operating system can obtain relevant information.

And the processor 303 is configured to execute an instruction, and complete an operation related to the monitoring terminal system (for example, using an instruction acquired from the memory); the processor 303 can control receiving and manipulating of input and output data between components of the monitoring terminal system; the processor may be implemented on a single chip, multiple chips, or multiple electronic elements, and may use multiple architectures, including a dedicated or embedded processor, a dedicated processor, a controller, an application specific integrated circuit (Application Specific Integrated Circuit, ASIC for short), and the like.

When the monitoring terminal runs, the processor 303 communicates with the memory 302, and the processor 303 is configured to:

detect power information of the monitored device;

set a monitoring time interval according to the power information and a preset time interval; and detect the power information of the monitored device according to the monitoring time interval.

Optionally, the processor 303 is further configured to:

detect power information of the monitored device at two consecutive times;

calculate a power decline rate of the monitored device according to the power information detected at two consecutive times and the preset time interval; and if the power decline rate of the monitored device is less than a preset power decline rate, set the monitoring time interval to be greater than duration of the preset time interval; or if the power decline rate of the monitored device is greater than a preset power decline rate, set the monitoring time interval to be less than duration of the preset time interval.

Optionally, the processor 303 is further configured to:

divide a power range into different power intervals according to a preset power value; and determine, according to the acquired power information, a power interval in which power of the monitored device lies.

Optionally, the power intervals include a high-level power interval and a low-level power interval; the high-level power interval is that a minimum power value of the power interval is greater than a preset level threshold; and the low-level power interval is that the minimum power value of the power interval is less than the preset level threshold; and the processor 303 is further configured to:

if it is determined, according to the acquired power information, that the power interval in which the power of the monitored device lies is a high-level power interval, set the monitoring time interval to be greater than duration of the preset time interval; or if it is determined, according to the acquired power information, that the power interval in which the power of the monitored device lies is a low-level power interval, set the monitoring time interval to be less than duration of the preset time interval.

Optionally, the power information includes a use frequency of the monitored device; and the processor 303 is further configured to:

when the use frequency indicated by the power information is higher than a preset use frequency, set the monitoring time interval to be less than duration of the preset time interval; or when the use frequency indicated by the power information is lower than a preset use frequency, set the monitoring time interval to be greater than duration of the preset time interval.

Optionally, the processor 303 is further configured to:

send a query request for the power information to the monitored device; or detect and acquire the power information actively reported by the monitored device.

Optionally, the processor 303 is further configured to:

determine, according to the power information and the preset power threshold, whether it is necessary to give an alarm, and if necessary, deliver an alarm.

The monitoring terminal in this embodiment may be configured to execute the method in the method embodiment, and implementation principles and technical effects of the monitoring terminal are similar and are not described herein again.

Figure 4:
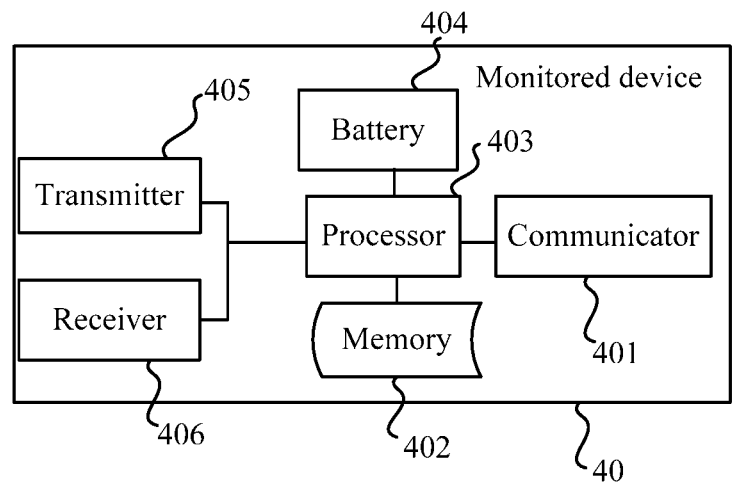
FIG. 4 is a schematic structural diagram of a first embodiment of a monitored device according to the present invention.

FIG. 4 is a schematic structural diagram of a first embodiment of a monitored device according to the present invention. As shown in FIG. 4, a monitored device 40 provided in this embodiment includes a communicator 401, a memory 402, a processor 403, and a battery 404; and may further include a transmitter 405 and a receiver 406. The transmitter 405 and the receiver 406 may be connected to the processor 403. The transmitter 405 is configured to send data or information, and the receiver 406 is configured to receive the data or information;

the battery 404, for example, a rechargeable battery, is configured to supply power to different parts of the monitored device to maintain running of the monitored device; the communicator 401 is configured to communicate with a monitoring terminal or another device, and is configured to receive a query request sent by the monitoring terminal, and return power information to the monitoring terminal; the communicator 401 is further configured to receive a monitoring time interval and a preset power threshold that are sent by the monitoring terminal; the memory 402 is configured to store an execution instruction or data; when the monitored device 40 runs, the processor 403 communicates with the memory 402, and the processor 403 is configured to:

respond to the query request of the monitoring terminal, detect current power of the battery, and return the power information to the monitoring terminal; and detect and acquire the power information of the monitored device according to the monitoring time interval sent by the monitoring terminal, and determine, according to the power information and the preset power threshold, whether to deliver an alarm, and if necessary, deliver an alarm.

The monitored device in this embodiment may be configured to execute the technical solution in the method embodiment, and implementation principles and technical effects of the monitored device are similar and are not described herein again.

Figure 5:
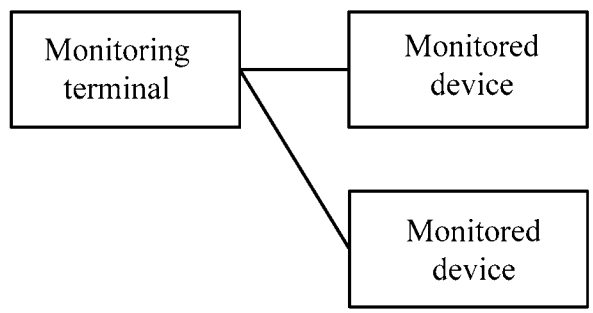
FIG. 5 is a schematic structural diagram of a first embodiment of a system for detecting device power according to the present invention.

FIG. 5 is a schematic structural diagram of a first embodiment of a system for detecting device power according to the present invention. As shown in FIG. 5, the system provided in this embodiment includes a monitoring terminal and at least one monitored device, where the monitoring terminal may use either of structures of monitoring terminal embodiments in FIG. 2 to FIG. 3, and is configured to detect power information of the monitored device, set a monitoring time interval according to the power information and a preset time interval, and detect the power information of the monitored device according to the monitoring time interval; correspondingly, the monitoring terminal may execute the technical solution of the method embodiment in FIG. 1; the monitored device may use a structure of the monitored device embodiment shown in FIG. 4, and is configured to respond to a query request of the monitoring terminal, detect current power of a battery, and return the power information to the monitoring terminal; and the monitored device is further configured to detect and acquire the power information of the monitored device according to the monitoring time interval sent by the monitoring terminal, and determine, according to the power information and a preset power threshold, whether to deliver an alarm. Implementation principles and technical effects of the system are similar and are not described herein again.

In the several embodiments provided in the present application, it should be understood that the disclosed device and method may be implemented in other manners. For example, the described device embodiment is merely exemplary. For example, the unit or module division is merely logical function division and may be other division in actual implementation. For example, a plurality of units or modules may be combined or integrated into another system, or some features may be ignored or not performed. In addition, the displayed or discussed mutual couplings or direct couplings or communication connections may be implemented through some interfaces. The indirect couplings or communication connections between the devices or modules may be implemented in electronic, mechanical, or other forms.

The modules described as separate parts may or may not be physically separate, and parts displayed as modules may or may not be physical modules, may be located in one position, or may be distributed on a plurality of network units. A part or all of the modules may be selected according to actual needs to achieve the objectives of the solutions of the embodiments.

Persons of ordinary skill in the art may understand that all or a part of the steps of the method embodiments may be implemented by a program instructing relevant hardware. The program may be stored in a computer-readable storage medium. When the program runs, the steps of the method embodiments are performed. The foregoing storage medium includes: any medium that can store program code, such as a ROM, a RAM, a magnetic disc, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A method for detecting device power comprising:
   detecting, by a monitoring terminal, power information of a monitored device;
   setting, by the monitoring terminal, a monitoring time interval according to the power information of the monitored device and a preset time interval; and
   detecting, by the monitoring terminal after setting the monitoring time interval, the power information of the monitored device according to the monitoring time interval;
   wherein, prior to setting the monitoring time interval, the power information of the monitored device is detected at two consecutive times;
   wherein setting the monitoring time interval further comprises:
   calculating a power decline rate of the monitored device according to the power information of the monitored device detected at the two consecutive times and the preset time interval;
   comparing the calculated power decline rate to a preset power decline rate; and
   setting the monitoring time interval to be greater than the preset time interval in response to the calculated power decline rate being less than the preset power decline rate, or setting the monitoring time interval to be less than the preset time interval in response to the calculated power decline rate being greater than the preset power decline rate.

2. The method according to claim 1, wherein before setting the monitoring time interval, the method further comprises:
   dividing a power range into different power intervals; and
   determining, according to the power information of the monitored device, a power interval corresponding to a current power level of the monitored device.

3. The method according to claim 2, wherein the power intervals comprise a high-level power interval and a low-level power interval, wherein a minimum power value of the high-level power interval is greater than a preset power threshold and a minimum power value of the low-level power interval is less than the preset power threshold; and
   wherein determining that the power interval corresponding to the current power level of the monitored device is the high-level interval corresponds to setting the monitoring time interval to be greater than the preset time interval and determining that the power interval corresponding to the current power level of the monitored device is the low-level interval corresponds to setting the monitoring time interval to be less than the preset time interval.

4. The method according to claim 1, wherein the power information of the monitored device comprises a use frequency of the monitored device; and
   wherein setting the monitoring time interval further comprises:
   comparing the use frequency indicated by the power information of the monitored device to a preset use frequency; and
   setting the monitoring time interval to be less than the preset time interval in response to the use frequency indicated by the power information of the monitored device being higher than the preset use frequency; or setting the monitoring time interval to be greater than the preset time interval in response to the use frequency indicated by the power information of the monitored device being lower than the preset use frequency.

5. The method according to claim 1, wherein detecting the power information of the monitored device further comprises:
   sending, by the monitoring terminal, a query request for the power information of the monitored device to the monitored device.

6. The method according to claim 1, wherein after detecting the power information of the monitored device according to the monitoring time interval, the method further comprises:
   determining, by the monitoring terminal according to the power information of the monitored device and a preset power threshold, whether to provide an alarm; or
   sending, by the monitoring terminal, the monitoring time interval and the preset power threshold to the monitored device to enable the monitored device to detect the power information of the monitored device according to the monitoring time interval, and determine, according to the power information of the monitored device and the preset power threshold, whether to provide an alarm.

7. A monitoring terminal comprising:
   a transmitter configured to send a query request to a monitored device;
   a receiver configured to receive power information of the monitored device from the monitored device;
   a non-transitory memory configured to store processor-executable instructions; and
   a processor configured, based on execution of the processor-executable instructions stored on the non-transitory memory, to:
      detect the power information of the monitored device;
      set a monitoring time interval according to the power information of the monitored device and a preset time interval; and
      detect, after setting the monitoring time interval, the power information of the monitored device according to the monitoring time interval;
   wherein the processor is further configured to:
      detect the power information of the monitored device at two consecutive times prior to setting the monitoring time interval;
      calculate a power decline rate of the monitored device according to the power information of the monitored device detected at the consecutive two times and the preset time interval;
      if the power decline rate of the monitored device is less than a preset power decline rate, set the monitoring time interval to be greater than the preset time interval; and
      if the power decline rate of the monitored device is greater than the preset power decline rate, set the monitoring time interval to be less than the preset time interval.

8. The monitoring terminal according to claim 7, wherein the processor is further configured to:
   divide a power range into different power intervals; and
   determine, according to the power information of the monitored device, a power interval corresponding to a current power level of the monitored device.

9. The monitoring terminal according to claim 8, wherein the power intervals comprise a high-level power interval and a low-level power interval, wherein a minimum power value of the high-level power interval is greater than a preset power threshold and a minimum power value of the low-level power interval is less than the preset power threshold; and
   wherein the processor is further configured to:
      if the power interval corresponding to the current power level of the monitored device is the high-level power interval, set the monitoring time interval to be greater than the preset time interval; and
      if the power interval corresponding to the current power level of the monitored device is the low-level power interval, set the monitoring time interval to be less than the preset time interval.

10. The monitoring terminal according to claim 7, wherein the power information of the monitored device comprises a use frequency of the monitored device; and
    wherein the processor is further configured to:
       when the use frequency indicated by the power information of the monitored device is higher than a preset use frequency, set the monitoring time interval to be less than the preset time interval; and
       when the use frequency indicated by the power information of the monitored device is lower than the preset use frequency, set the monitoring time interval to be greater than the preset time interval.

11. The monitoring terminal according to claim 7, wherein the processor is further configured to:
    determine, according to the power information of the monitored device and a preset power threshold, whether to provide an alarm; or
    send the monitoring time interval and the preset power threshold to the monitored device to enable the monitored device to detect the power information of the monitored device according to the monitoring time interval and determine, according to the power information of the monitored device and the preset power threshold, whether to provide an alarm.

12. A non-transitory computer-readable medium having processor-executable instructions stored thereon for detecting device power, the processor-executable instructions, when executed, facilitating performance of the following:
    detecting, by a monitoring terminal, power information of a monitored device;
    setting, by the monitoring terminal, a monitoring time interval according to the power information of the monitored device and a preset time interval; and
    detecting, by the monitoring terminal after setting the monitoring time interval, the power information of the monitored device according to the monitoring time interval;
    wherein the processor-executable instructions, when executed, further facilitate detecting the power information of the monitored device at two consecutive times prior to setting the monitoring time interval;
    wherein setting the monitoring time interval further comprises:
       calculating a power decline rate of the monitored device according to the power information of the monitored device detected at the two consecutive times and the preset time interval;
       comparing the calculated power decline rate to a preset power decline rate; and
       setting the monitoring time interval to be greater than the preset time interval in response to the calculated power decline rate being less than the preset power decline rate, or setting the monitoring time interval to be less than the preset time interval in response to the calculated power decline rate being greater than the preset power decline rate.

13. The non-transitory computer-readable medium according to claim 12, wherein the processor-executable instructions, when executed, further facilitate, before setting the monitoring time interval:
dividing a power range into different power intervals; and
determining, according to the power information of the monitored device, a power interval corresponding to a current power level of the monitored device.

14. The non-transitory computer-readable medium according to claim 13, wherein the power intervals comprise a high-level power interval and a low-level power interval, wherein a minimum power value of the high-level power interval is greater than a preset power threshold and a minimum power value of the low-level power interval is less than the preset power threshold; and
wherein determining that the power interval corresponding to the current power level of the monitored device is the high-level interval corresponds to setting the monitoring time interval to be greater than the preset time interval and determining that the power interval corresponding to the current power level of the monitored device is the low-level interval corresponds to setting the monitoring time interval to be less than the preset time interval.

15. The non-transitory computer-readable medium according to claim 12, wherein the power information of the monitored device comprises a use frequency of the monitored device; and
wherein setting the monitoring time interval further comprises:
comparing the use frequency indicated by the power information of the monitored device to a preset use frequency; and
setting the monitoring time interval to be less than the preset time interval in response to the use frequency indicated by the power information of the monitored device being higher than the preset use frequency, or setting the monitoring time interval to be greater than the preset time interval in response to the use frequency indicated by the power information of the monitored device being lower than the preset use frequency.

16. The non-transitory computer-readable medium according to claim 12, wherein detecting the power information of the monitored device further comprises:
sending, by the monitoring terminal, a query request for the power information of the monitored device to the monitored device.

17. The non-transitory computer-readable medium according to claim 12, wherein the processor-executable instructions, when executed, further facilitate, after detecting the power information of the monitored device according to the monitoring time interval:
determining, by the monitoring terminal according to the power information of the monitored device and a preset power threshold, whether to provide an alarm; or
sending, by the monitoring terminal, the monitoring time interval and the preset power threshold to the monitored device to enable the monitored device to detect the power information of the monitored device according to the monitoring time interval, and determine, according to the power information of the monitored device and the preset power threshold, whether to provide an alarm.

* * * * *